(12) United States Patent
Chen et al.

(10) Patent No.: US 7,545,700 B2
(45) Date of Patent: Jun. 9, 2009

(54) MEMORY POWER SUPPLY CIRCUIT

(75) Inventors: Ying Chen, Shenzhen (CN); Jin-Liang Xiong, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 8 days.

(21) Appl. No.: 11/946,858

(22) Filed: Nov. 29, 2007

(65) Prior Publication Data

US 2008/0266996 A1    Oct. 30, 2008

(30) Foreign Application Priority Data

Apr. 29, 2007    (CN) .................. 2007 1 0200566

(51) Int. Cl.
*G11C 5/14*    (2006.01)
(52) U.S. Cl. ............... 365/226; 365/189.09; 365/207; 365/230.06
(58) Field of Classification Search ......... 365/226, 365/189.09, 207, 230.06
See application file for complete search history.

(56) References Cited

U.S. PATENT DOCUMENTS

| | | | |
|---|---|---|---|
| 5,251,178 A | | 10/1993 | Childers |
| 6,288,951 B1 * | | 9/2001 | Chen et al. ............. 365/189.09 |
| 6,747,904 B2 * | | 6/2004 | Chen ..................... 365/189.09 |
| 7,026,824 B2 * | | 4/2006 | Chen ......................... 324/541 |

* cited by examiner

*Primary Examiner*—Connie C Yoha
(74) *Attorney, Agent, or Firm*—Frank R. Niranjan

(57) ABSTRACT

A memory power supply circuit configured for supplying power to two types of memories slots of a motherboard includes a slot detecting terminal configured to connect with a detecting pin of the motherboard which is used to detect the memory slots, an electrical switch element, a first resistor, a second resistor, a third resistor, and a voltage output terminal connected to power input pins of the two types of memories slots. The second resistor and third resistor are connected in series between a first power supply and ground. The slot detecting terminal is connected to a first terminal of the electrical switch element. A second terminal of the electrical switch element is grounded. A third terminal of the electrical switch element is connected to the voltage output terminal via the first resistor and connected to a node between the second and third resistors.

10 Claims, 1 Drawing Sheet

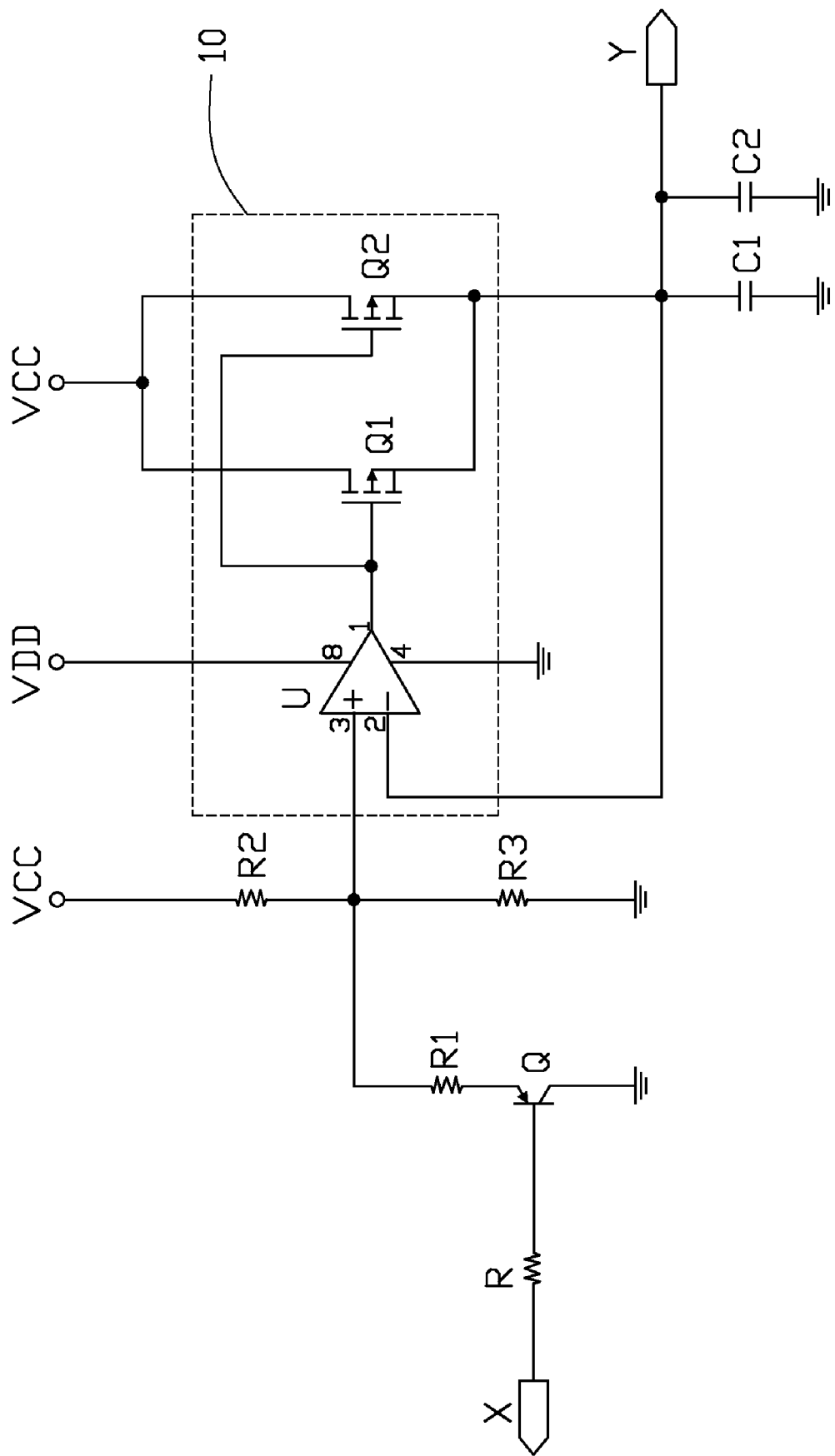

MEMORY POWER SUPPLY CIRCUIT

BACKGROUND

1. Field of the Invention

The present invention relates to power supply circuits, and particularly to a memory power supply circuit which supplies power to memories.

2. Description of Related Art

Generally speaking, memories of the computer have two types double data rate (DDR) SDRAM and double data rate 2 (DDR2) SDRAM. However, the two types of memories have different interfaces (namely DDR has 180 pins, DDR2 has 240 pins) and different work voltages (namely DDR is 2.6V, DDR2 is 1.8V), thereby, they cannot use a same memory slot.

Nowadays, some motherboards integrate DDR and DDR2 SDRAM slots therein. However, the two types of memories slots usually each have a memory power supply circuits for supplying power thereto, which increases the costs and occupies a lot of space of the motherboard.

What is needed is to provide a memory power supply circuit which can support the two types of memories slots.

SUMMARY

An embodiment of a memory power supply circuit configured for supplying power to two types of memories slots of a motherboard includes a slot detecting terminal configured to connect with a detecting pin of the motherboard which is used to detect the memory slots, an electrical switch element, a first resistor, a second resistor, a third resistor, and a voltage output terminal connected to power input pins of the two types of memories slots. The second resistor and third resistor are connected in series between a first power supply and ground. The slot detecting terminal is connected to a first terminal of the electrical switch element. A second terminal of the electrical switch element is grounded. A third terminal of the electrical switch element is connected to the voltage output terminal via the first resistor and connected to a node between the second and third resistors.

Other advantages and novel features of the present invention will become more apparent from the following detailed description of an embodiment when taken in conjunction with the accompanying drawing, in which:

BRIEF DESCRIPTION OF THE DRAWING

The drawing is a circuit diagram of a memory power supply circuit in accordance with an embodiment of the present invention.

DETAILED DESCRIPTION

Referring to the drawing, a memory power supply circuit in accordance with an embodiment of the present invention is configured for supplying power to two types of memories slots of a motherboard. The memory power supply circuit includes a slot detecting terminal X, an electrical switch element Q, a current-limiting resistor R, a first resistor R1, a second resistor R2, a third resistor R3, a voltage negative feedback circuit 10, a porcelain capacitor C1, an electrolytic capacitor C2, and a voltage output terminal Y.

The voltage negative feedback circuit 10 includes an operational amplifier (op-amp) U, a first field-effect transistor (FET) Q1, and a second FET Q2. The op-amp U includes a non-inverting input terminal 3, an inverting input terminal 2, a power terminal 8, a ground terminal 4, and an output terminal 1. In this embodiment, the electrical switch element Q is a PNP transistor. The two types of memories slots are respectively DDR SDRAM slot and DDR2 SDRAM slot. The resistance of the first resistor R1 is 1.75 KΩ. The resistance of the second resistor R2 is 1 KΩ. The resistance of the third resistor R3 is 3.7 KΩ.

The slot detecting terminal X is configured to connect with a detecting pin of the motherboard which is used to detect the memory slots. The slot detecting terminal X is connected to a first terminal (base) of the electrical switch element Q via the current-limiting resistor R. A second terminal (collector) of the electrical switch element Q is grounded. A third terminal (emitter) of the electrical switch element Q is connected to the non-inverting input terminal 3 of the op-amp U via the first resistor R1. The second and third resistors R2 and R3 are connected in series between a 3.3V first power supply VCC and ground. A node between the second and third resistors R2 and R3 is connected to the non-inverting input terminal 3 of the op-amp U. The inverting input terminal 2 of the op-amp U is connected to the voltage output terminal Y, and connected to ground via the porcelain capacitor C1, and connected to ground via the electrolytic capacitor C2. The power terminal 8 of the op-amp U is connected to a 12V second power supply VDD. The ground terminal 4 of the op-amp U is grounded. The output terminal 1 of the op-amp U is connected to the gates of the first and second FETs Q1 and Q2. The drains of the first and second FETs Q1 and Q2 are connected to the first power supply VCC. The sources of the first and second FETs Q1 and Q2 are connected to the inverting input terminal 2 of the op-amp U. The voltage output terminal Y is connected to power input pins of the two types of memories slots.

The negative feedback circuit 10 is configured to steady the voltage from the node between the second and third resistors R2 and R3. In other embodiments, the negative feedback circuit 10 can be deleted as a cost saving measure. That is the voltage output terminal Y is connected to the node between the second and third resistors R2 and R3 after deleting the negative feedback circuit 10.

In working, if a DDR SDRAM is mounted in the DDR SDRAM slot, and the DDR SDRAM 2 slot is empty, the detecting pin of the motherboard transmits a high level voltage signal to the slot detecting terminal X, thereby the electrical switch element Q is turned off. The voltage of the non-inverting input terminal 3 of the op-amp U can be calculated as: V+=[3.7/(3.7+1)]*3.3=2.6V. The negative feedback circuit 10 can steady the 2.6V voltage. The 2.6V voltage of the non-inverting input terminal 3 of the op-amp U is supplied to the DDR SDRAM slot via the voltage output terminal Y.

If a DDR SDRAM 2 is mounted in the DDR SDRAM 2 slot, and the DDR SDRAM slot is empty, the detecting pin of the motherboard transmits a low level voltage signal to the slot detecting terminal X, thereby the electrical switch element Q is turned on. The voltage of the non-inverting input terminal 3 of the op-amp U can be calculated as: V+={[(3.7*1.75)/(3.7+1.75)]/[1+(3.7*1.75)/(3.7+1.75)]}*3.3=1.8V. The negative feedback circuit 10 can steady the 1.8V voltage. The 1.8V voltage of the non-inverting input terminal 3 of the op-amp U is supplied to the DDR SDRAM 2 slot via the voltage output terminal Y.

If a DDR SDRAM is mounted in the DDR SDRAM slot, and the DDR SDRAM 2 slot is mounted in the DDR SDRAM 2 slot, the detecting pin of the motherboard transmits a low level voltage signal to the slot detecting terminal X. The non-inverting input terminal 3 of the op-amp U is supplied 1.8V to the DDR SDRAM slot and DDR SDRAM 2 slot via the voltage output terminal Y. At this time, the DDR SDRAM cannot work, but the DDR SDRAM 2 will work, so that the motherboard can also work normally.

The memory power supply circuit can supply power to the two types of memories slots of the motherboard, which can reduce the costs and save space of the motherboard.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A memory power supply circuit configured for supplying power to two types of memories slots of a motherboard, comprising:
    a slot detecting terminal configured to connect with a detecting pin of the motherboard which is used to detect the memory slots;
    an electrical switch element having a first terminal, a second terminal connected to ground, and a third terminal;
    a first resistor;
    a second resistor and a third resistor connected in series between a first power supply and ground; and
    a voltage output terminal connected to power input pins of the two types of memories slots, the slot detecting terminal connected to the first terminal of the electrical switch element, a third terminal of the electrical switch element connected to the voltage output terminal via the first resistor and connected to a node between the second and third resistors.

2. The memory power supply circuit as claimed in claim 1, wherein a current-limiting resistor is connected between the slot detecting terminal and the first terminal of the electrical switch element.

3. The memory power supply circuit as claimed in claim 1, wherein the electrical switch element is a PNP transistor, the first terminal is the base of the PNP transistor, the second terminal is the collector of the PNP transistor, and the third terminal is the source of the PNP transistor.

4. The memory power supply circuit as claimed in claim 1, wherein the first power supply is 3.3V, the resistance of the first resistor is 1.75 KΩ, the resistance of the second resistor is 1 KΩ, the resistance of the third resistor is 3.7 KΩ.

5. A memory power supply circuit configured for supplying power to two types of memories slots of a motherboard, comprising:

a slot detecting terminal configured to connect with a detecting pin of the motherboard which is used to detect the memory slots;
    an electrical switch element having a first terminal, a second terminal connected to ground, and a third terminal;
    a first resistor;
    a second resistor and a third resistor connected in series between a first power supply and ground;
    a voltage negative feedback circuit; and
    a voltage output terminal connected to power input pins of the two types of memories slots, the slot detecting terminal connected to the first terminal of the electrical switch element, a third terminal of the electrical switch element connected to a first input terminal of the voltage negative feedback circuit via the first resistor and connected to a node between the second and third resistors, a second terminal of the voltage negative feedback circuit connected to the voltage output terminal.

6. The memory power supply circuit as claimed in claim 5, wherein the voltage negative feedback circuit includes an operational amplifier (op-amp), a first field-effect transistor (FET), and a second FET, the first input terminal of the voltage negative feedback circuit is the non-inverting input terminal of the op-amp, the second input terminal of the voltage negative feedback circuit is the inverting input terminal of the op-amp, the output terminal of the op-amp is connected to the gates of the first and second FETs, the drains of the first and second FETs are connected to the first power supply, the sources of the first and second FETs are connected to the inverting input terminal of the op-amp.

7. The memory power supply circuit as claimed in claim 5, wherein a current-limiting resistor is connected between the slot detecting terminal and the first terminal of the electrical switch element.

8. The memory power supply circuit as claimed in claim 5, wherein the electrical switch element is a PNP transistor, the first terminal is the base of the PNP transistor, the second terminal is the collector of the PNP transistor, and the third terminal is the source of the PNP transistor.

9. The memory power supply circuit as claimed in claim 5, wherein the first power supply is 3.3V, the resistance of the first resistor is 1.75 KΩ, the resistance of the second resistor is 1 KΩ, the resistance of the third resistor is 3.7 KΩ.

10. The memory power supply circuit as claimed in claim 5, wherein the voltage output terminal is connected to ground via a porcelain capacitor and connected to ground via an electrolytic capacitor.

* * * * *